(12) United States Patent
Lee

(10) Patent No.: US 12,219,820 B2
(45) Date of Patent: Feb. 4, 2025

(54) ORGANIC LIGHT-EMITTING DISPLAY DEVICE AND METHOD OF MANUFACTURING THE SAME

(71) Applicant: SAMSUNG DISPLAY CO., LTD., Yongin-si (KR)

(72) Inventor: Duckjung Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/317,048

(22) Filed: May 12, 2023

(65) Prior Publication Data

US 2023/0284485 A1 Sep. 7, 2023

Related U.S. Application Data

(63) Continuation of application No. 17/365,940, filed on Jul. 1, 2021, now Pat. No. 11,723,237, which is a continuation of application No. 16/288,715, filed on Feb. 28, 2019, now Pat. No. 11,056,547.

(30) Foreign Application Priority Data

Mar. 9, 2018 (KR) .................. 10-2018-0028268

(51) Int. Cl.
*H10K 59/122* (2023.01)
*H10K 71/00* (2023.01)
*H10K 71/20* (2023.01)
*H10K 59/12* (2023.01)

(52) U.S. Cl.
CPC ........... *H10K 59/122* (2023.02); *H10K 71/00* (2023.02); *H10K 71/221* (2023.02); *H10K 59/1201* (2023.02)

(58) Field of Classification Search
CPC ..................... H10K 59/173; H10K 59/122
See application file for complete search history.

(56) References Cited

U.S. PATENT DOCUMENTS

| | | |
|---|---|---|
| 9,299,949 B2 | 3/2016 | Hwang |
| 9,401,390 B2 | 7/2016 | Song et al. |
| 10,026,790 B2 | 7/2018 | Kim et al. |
| 10,205,124 B2 | 2/2019 | Park et al. |
| 10,566,396 B2 | 2/2020 | Lee et al. |
| 10,854,693 B2 | 12/2020 | Shim et al. |

(Continued)

FOREIGN PATENT DOCUMENTS

| | | |
|---|---|---|
| CN | 107331647 A | 11/2017 |
| CN | 107331691 A | 11/2017 |

(Continued)

*Primary Examiner* — Evan G Clinton
(74) *Attorney, Agent, or Firm* — Lewis Roca Rothgerber Christie LLP

(57) ABSTRACT

An organic light-emitting display device includes: a substrate; a pixel electrode on the substrate; a pixel defining layer having a first opening exposing a center portion of the pixel electrode; a barrier layer on the pixel defining layer; an intermediate layer including a first common layer, a first emissive layer, and a second common layer sequentially arranged on the pixel electrode, the pixel defining layer, and the barrier layer; and a first opposite electrode covering the intermediate layer. The barrier layer has a second opening that is larger than the first opening and has an undercut structure.

18 Claims, 15 Drawing Sheets

(56) References Cited

U.S. PATENT DOCUMENTS

| | | | | |
|---|---|---|---|---|
| 2013/0001620 A1* | 1/2013 | Sugisawa | ............. | H10K 59/122 |
| | | | | 257/E33.062 |
| 2014/0319481 A1* | 10/2014 | Lee | ..................... | H10K 59/873 |
| | | | | 438/26 |
| 2014/0332779 A1 | 11/2014 | Lin | | |
| 2015/0044801 A1 | 2/2015 | Lee et al. | | |
| 2017/0125506 A1* | 5/2017 | Kim | ..................... | G09G 3/3225 |
| 2018/0315806 A1 | 11/2018 | Lee et al. | | |

FOREIGN PATENT DOCUMENTS

| | | |
|---|---|---|
| EP | 2 744 008 A1 | 6/2014 |
| JP | 2001-148289 A | 5/2001 |
| JP | 2012-253014 A | 12/2012 |
| KR | 2002-0029553 A | 4/2002 |
| KR | 10-2013-0007971 | 1/2013 |
| KR | 10-2015-0041509 | 4/2015 |
| KR | 10-2015-0087997 A | 7/2015 |
| KR | 10-2017-0015637 | 2/2017 |
| KR | 10-2017-0137977 | 12/2017 |
| KR | 10-2017-0140486 | 12/2017 |
| WO | WO-2018233297 A1 * | 12/2018 ............. H01L 27/32 |

\* cited by examiner

ORGANIC LIGHT-EMITTING DISPLAY DEVICE AND METHOD OF MANUFACTURING THE SAME

CROSS-REFERENCE TO RELATED APPLICATIONS

This application is a continuation of U.S. patent application Ser. No. 17/365,940, filed Jul. 1, 2021, which is a continuation of U.S. patent application Ser. No. 16/288,715, filed Feb. 28, 2019, now U.S. Pat. No. 11,056,547, which claims priority to and the benefit of Korean Patent Application No. 10-2018-0028268, filed Mar. 9, 2018, the entire content of all of which is incorporated herein by reference.

BACKGROUND

1. Field

Aspects of embodiments of the present disclosure relate to an organic light-emitting display device and a method of manufacturing the same.

2. Description of the Related Art

An organic light-emitting display device includes organic light-emitting elements, each including a hole injection electrode, an electron injection electrode, and an organic emissive layer interposed therebetween. The organic light-emitting display device is a self-emissive display device in which excitons are generated when holes injected from the hole injection electrode and electrons injected from the electron injection electrode are combined in the organic emissive layer, and light is generated as excitons fall from an excited state to a ground state.

Using a fine metal mask (FMM) to deposit the organic emissive layer on a substrate has drawbacks, such as relatively high manufacturing costs and high alignment demands, and as such, alternative deposition techniques have been researched.

SUMMARY

Embodiments of the present disclosure include an organic light-emitting display device and a method of manufacturing the same that overcome some of the drawbacks of a fine metal mask and prevent or substantially reduce leakage current. However, the aspects and features of the present disclosure described herein are exemplary and do not limit the scope of the present disclosure. Additional aspects and features of the present disclosure will be set forth, in part, in the following description and, in part, will be apparent from the description or may be learned by practice of the described embodiments.

According to an embodiment, an organic light-emitting display device includes: a substrate; a pixel electrode on the substrate; a pixel defining layer having a first opening exposing a center portion of the pixel electrode; a barrier layer on the pixel defining layer, the barrier layer having a second opening that is larger than the first opening and having an undercut structure; an intermediate layer including a first common layer, a first emissive layer, and a second common layer sequentially arranged on the pixel electrode, the pixel defining layer, and the barrier layer; and a first opposite electrode covering the intermediate layer.

Portions of the first opposite electrode on the pixel electrode, the pixel defining layer, and the barrier layer may be connected to each other.

Portions of the second common layer on the pixel electrode, the pixel defining layer, and the barrier layer may be connected to each other.

Portions of the first emissive layer on the pixel electrode, the pixel defining layer, and the barrier layer may be connected to each other.

Portions of the first common layer may be disconnected from each other at a boundary between the pixel defining layer and the barrier layer.

A thickness of the barrier layer may be greater than a thickness of the intermediate layer.

A thickness of the barrier layer may be greater than a thickness of the first common layer.

The barrier layer may include a first barrier layer and a second barrier layer on the first barrier layer, and the second barrier layer may have an undercut structure.

The first opposite electrode may completely cover the intermediate layer.

The organic light-emitting display device may further include a common electrode on the first opposite electrode.

According to another embodiment, an organic light-emitting display device includes: a substrate; a pixel electrode on the substrate; a pixel defining layer having a first opening exposing a center portion of the pixel electrode, the first opening having an undercut structure; an intermediate layer including a first common layer, a first emissive layer, and a second common layer sequentially arranged on the pixel electrode and the pixel defining layer; and a first opposite electrode covering the intermediate layer.

Portions of the first opposite electrode on the pixel electrode and the pixel defining layer may be connected to each other.

Portions of the first common layer may be disconnected from each other at a boundary between the pixel defining layer and the pixel electrode.

A thickness of the pixel defining layer may be greater than a thickness of the first common layer.

According to another embodiment, a method of manufacturing an organic light-emitting display device includes: forming a plurality of pixel electrodes on a substrate; forming a pixel defining layer having a plurality of first openings respectively exposing a center portion of the plurality of pixel electrodes; forming a barrier layer on the pixel defining layer and between the plurality of pixel electrodes, the barrier layer having a plurality of second openings that are larger than corresponding ones of the first openings and have an undercut structure; forming a first lift-off layer and a first photoresist covering the plurality of pixel electrodes, the pixel defining layer, and the barrier layer; patterning the first lift-off layer and the first photoresist to form a third opening therein at a position corresponding to a first pixel electrode from among the plurality of pixel electrodes; forming a first intermediate layer including a first common layer, a first emissive layer, and a second common layer in the third opening; forming a first opposite electrode covering the first intermediate layer; and removing the first lift-off layer and the first photoresist.

A thickness of the pixel defining layer may be greater than a thickness of the first common layer.

The first lift-off layer may include fluorine.

In the removing of the first lift-off layer and the first photoresist, the first lift-off layer may be removed by using a solvent comprising fluorine.

The method may further include: forming a second lift-off layer and a second photoresist after the removing of the first lift-off layer and the first photoresist; forming a fourth opening in the second lift-off layer and the second photoresist at a position corresponding to a second pixel electrode from among the pixel electrodes and at a position different from the position of the first pixel electrode; forming a second intermediate layer including a first common layer, a second emissive layer, and a second common layer in the fourth opening; forming a second opposite electrode covering the second intermediate layer; and removing the second lift-off layer and the second photoresist.

According to another embodiment, a method of manufacturing an organic light-emitting display device includes: forming a plurality of pixel electrodes on a substrate; forming a pixel defining layer having a plurality of first openings respectively exposing a center portion of the pixel electrodes and having an undercut structure; forming a first lift-off layer and a first photoresist covering the pixel electrodes and the pixel defining layer; forming a third opening in the first lift-off layer and the first photoresist at a position corresponding to a first pixel electrode from among the plurality of pixel electrodes; forming a first intermediate layer including a first common layer, a first emissive layer, and a second common layer in the third opening; forming a first opposite electrode covering the first intermediate layer; and removing the first lift-off layer and the first photoresist.

BRIEF DESCRIPTION OF THE DRAWINGS

These and/or other aspects and features of the present disclosure will become apparent and more readily appreciated from the following description of example embodiments, taken in conjunction with the accompanying drawings, in which.

DETAILED DESCRIPTION

Figure 1:
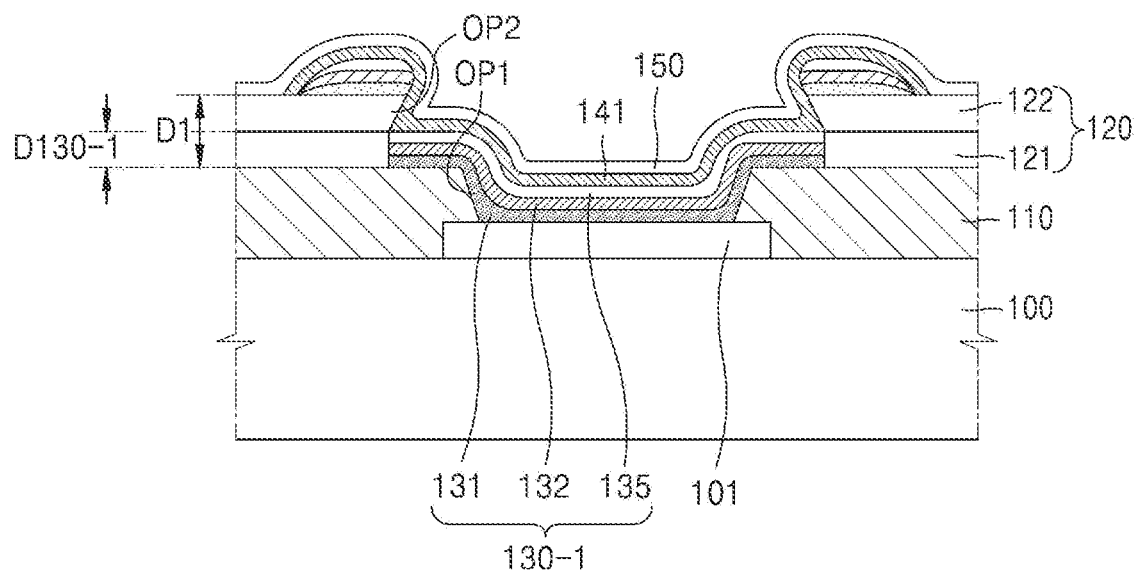
FIG. 1 is a schematic cross-sectional view of a portion of an organic light-emitting display device according to an embodiment of the present disclosure.

Reference will now be made in detail to example embodiments which are illustrated in the accompanying drawings. Like reference numerals refer to like elements throughout. In this regard, the presented example embodiments may have different forms and should not be construed as being limited to the descriptions set forth herein. Accordingly, example embodiments are merely described below, by referring to the figures, to explain aspects and features of the present description. As used herein, the term "and/or" includes any and all combinations of one or more of the associated listed items. Expressions, such as "at least one of", when preceding a list of elements, modify the entire list of elements and do not modify the individual elements of the list. Further, the use of "may" when describing embodiments of the present invention relates to "one or more embodiments of the present invention." Also, the term "exemplary" is intended to refer to an example or illustration. As used herein, the terms "use," "using," and "used" may be considered synonymous with the terms "utilize," "utilizing," and "utilized," respectively.

As the disclosure allows for various changes and numerous embodiments, example embodiments will be illustrated in the drawings and described in detail in the written description. Aspects, features, and a method of achieving the same will be specified with reference to the example embodiments described below in detail together with the attached drawings. However, the present disclosure may have different forms and should not be construed as being limited to the descriptions and example embodiments set forth herein.

It will be understood that although the terms "first," "second," etc. may be used herein to describe various components, these components should not be limited by these terms. These terms are only used to distinguish one component from another. Singular expressions, unless defined otherwise in the context, include plural expressions. In the embodiments below, it will be further understood that the terms "comprise," "include," and/or "have" used herein specify the presence of stated features or components but do not preclude the presence or addition of one or more other features or components.

It will be understood that when a component, such as a layer, a film, a region, or a plate, is referred to as being "on" another component, the component may be "directly on" the other component or intervening components may also be present.

Also, for convenience of explanation, sizes of components in the drawings may be exaggerated for convenience of explanation. Because sizes and thicknesses of components in the drawings may be arbitrarily illustrated for convenience of explanation, the following embodiments are not limited thereto.

When an embodiment is implementable in another manner, a process order may be implemented differently from how it is described. For example, two processes that are consecutively described may be performed concurrently or substantially simultaneously performed or may be performed in an opposite order to the described order.

FIG. 1 is a schematic cross-sectional view of a pixel of an organic light-emitting display device 1 according to an embodiment of the present disclosure.

Referring to FIG. 1, the organic light-emitting display device 1 includes a first pixel electrode 101 arranged on a substrate 100, a pixel defining layer 110 having a first opening OP1 exposing a center portion of the first pixel electrode 101, a barrier layer 120 arranged on the pixel defining layer 110 and having a second opening OP2 that is larger than the first opening OP1 and has an undercut structure, a first intermediate layer 130-1 arranged on the first pixel electrode 101, the pixel defining layer 110, and the barrier layer 120, a first opposite electrode 141 covering the first intermediate layer 130-1, and a common electrode 150 arranged on (e.g., in direct contact with) the first opposite electrode 141.

The substrate 100 may be formed of various suitable materials. For example, the substrate 100 may be formed of glass, metal, plastic, or the like. Plastics having excellent heat resistance and durability, such as polyimide, polyethylene naphthalate, polyethylene terephthalate, polyarylate, polycarbonate, polyetherimide or polyethersulfone, may be used to form the substrate 100.

The first pixel electrode 101 may be a hole injection electrode and may be formed of a material having a high work function. The first pixel electrode 101 may include a transparent conductive oxide material or component. For example, the first pixel electrode 101 may include at least one selected from the group including an indium tin oxide, an indium zinc oxide, a zinc oxide, an indium oxide, an indium gallium oxide, and an aluminum zinc oxide. The first pixel electrode 101 may be a single layer or a plurality of layers and may further include a metal, such as silver (Ag), aluminum (Al), magnesium (Mg), lithium (Li), and calcium (Ca), and/or an alloy of these metals. The first pixel electrode 101 is arranged in the form of an island.

The pixel defining layer 110 has the first opening OP1, which exposes a center portion of the first pixel electrode 101, and covers an edge of the first pixel electrode 101.

When low-voltage power is applied through the common electrode 150 and the first opposite electrode 141, which will be further described later, an electrical field may be concentrated at an end portion of the first pixel electrode 101 and an electric short may occur during driving. The pixel defining layer 110 may cover the edge of the first pixel electrode 101 to prevent or substantially reduce a concentration of an electric field at the edge of the first pixel electrode 101.

The pixel defining layer 110 may be formed of an organic insulating layer including at least one of an acrylic polymer, an imide polymer, an aryl ether polymer, an amide polymer, a fluorine polymer, a phenol polymer, a p-xylene polymer, and a vinyl alcohol polymer.

The barrier layer 120 having the second opening OP2, which is larger than the first opening OP1 in the pixel defining layer 110, is arranged on the pixel defining layer 110.

In the illustrated embodiment, the barrier layer 120 includes a first barrier layer 121 and a second barrier layer 122 having an undercut structure. The undercut structure refers to a structure in which an edge of a top surface of the second barrier layer 122 protrudes from an edge of a bottom surface thereof with respect to an imaginary reference line perpendicular to the substrate 100.

The first barrier layer 121 and the second barrier layer 122 may be formed of an inorganic insulating film or an organic insulating film. In the illustrated embodiment, a total thickness D1 of the barrier layer 120 including the first barrier layer 121 and the second barrier layer 122 is greater than a total thickness D130-1 of the first intermediate layer 130-1.

The first intermediate layer 130-1 is arranged on the first pixel electrode 101, the pixel defining layer 110, and the barrier layer 120. The first intermediate layer 130-1 may include a first common layer 131, a first emissive layer 132, and a second common layer 135.

Although the first common layer 131 is illustrated as being a single layer in FIG. 1, the present disclosure is not limited thereto. The first common layer 131 may include a hole injection layer and/or a hole transport layer and may further include other suitable functional layers, such as a hole injection layer, a hole transport layer, and/or the like. The first common layer 131 is arranged in an island shape.

In the illustrated embodiment, the first common layer 131 is disconnected at (e.g., is disconnected from itself) a boundary between the barrier layer 120 and the pixel defining layer 110 (e.g., a portion of the first common layer 131 on the barrier layer 120 and a portion of the first common layer 131 on the pixel defining layer 110 are disconnected or separated from each other). An end portion (e.g., a disconnected portion) of the first common layer 131 and the first opposite electrode 141 contact each other on the second barrier layer 122. When the first common layer 131 is disconnected at the boundary between the barrier layer 120 and the pixel defining layer 110, electrons injected into the first common layer 131 by the first opposite electrode 141 along a contact surface between the first opposite electrode 141 and the first common layer 131 on the second barrier layer 122 do not flow to the first pixel electrode 101 through the pixel defining layer 110. Accordingly, leakage current of an organic light-emitting element may be prevented or substantially reduced.

The first emissive layer 132 is arranged on the first common layer 131. The first emissive layer 132 may include a low molecular weight material and/or a polymer material. The first emissive layer 132 may include various suitable organic materials, such as copper phthalocyanine (CuPc), N,N'-di(naphthalene-1-yl)-N,N'-diphenyl-benzidine (NPB), tris-8-hydroxyquinoline aluminum (Alq3), and/or the like. The first emissive layer 132 may include other organic materials, such as poly-phenylene vinylene (PPV) or polyfluorene. The first emissive layer 132 is arranged in an island shape.

In the illustrated embodiment, the first emissive layer 132 is disconnected at the boundary between the barrier layer 120 and the pixel defining layer 110 (e.g., a portion of the first emissive layer 132 on the barrier layer 120 is disconnected from a portion of the first emissive layer 132 on the pixel defining layer 110). Because the first emissive layer 132 is disconnected from itself, the effect of the disconnection of the first common layer 131 described above is increased (e.g., doubled).

The second common layer 135 is arranged on the first emissive layer 132. Although the second common layer 135 is illustrated as being a single layer in FIG. 1, the present disclosure is not limited thereto. The second common layer 135 may include an electron transport layer and/or an electron injection layer and may further include suitable functional layers other than the electron injection layer or the electron transport layer. The second common layer 135 is arranged in an island shape.

In the illustrated embodiment, the second common layer 135 is disconnected at the boundary between the barrier layer 120 and the pixel defining layer 110 (e.g., a portion of the second common layer 135 on the barrier layer 120 is disconnected from a portion of the second common layer 135 on the pixel defining layer 110). Because the second common layer 135 is disconnected from itself, the effect of the disconnection of the first common layer 131 described above is increased (e.g., doubled).

The first opposite electrode 141 is arranged on the second common layer 135 in an island shape.

The first opposite electrode 141 may be a semi-transmissive electrode or a transmissive electrode and may be formed of a metal in the form of a thin film. The first opposite electrode 141 may have a thickness in a range of several nanometers to several tens of nanometers to transmit light. For example, the first opposite electrode 141 may include Ag, Al, Mg, Li, Ca, Cu, lithium fluoride/calcium (LiF/Ca), lithium fluoride/aluminum (LiF/Al), and/or a compound thereof (e.g., MgAg or CaAg). The first opposite electrode 141 may further include a transparent conductive material, such as ITO, IZO, ZnO, $In_2O_3$, IGO, and/or AZO.

In the illustrated embodiment, the first opposite electrode 141 is connected at (e.g., is connected to itself at or is continuous across) the boundary between the barrier layer 120 and the pixel defining layer 110 (e.g., the first opposite electrode 141 is not disconnected from itself at the boundary between the barrier layer 120 and the pixel defining layer 110). In addition, the first opposite electrode 141 is arranged to completely cover the first intermediate layer 130-1, which is arranged on the first pixel electrode 101, the pixel defining layer 110, and the barrier layer 120.

The common electrode 150 is arranged on the first opposite electrode 141. The common electrode 150 is not arranged in the form of an island in each pixel like the first opposite electrode 141 but has a single-body form commonly (e.g., continuously) arranged over a plurality of pixels (e.g., a single, continuous common electrode 150 may be formed over all of the pixels).

The common electrode 150 is configured to transfer a low voltage from a power supply wiring to the first pixel electrode 101 through the first opposite electrode 141, which is in direct contact with the common electrode 150. When a driving voltage is transmitted from a driving thin film transistor connected to the first pixel electrode 101 and reaches a threshold voltage, excitons are generated in the first emissive layer 132 and emit light as they fall from an excited state to a ground state.

Ideally, current does not flow through the organic light-emitting element before the driving voltage reaches the threshold voltage. However, in a conventional organic light-emitting display device, electrons may flow from the first opposite electrode 141 to the first common layer 131 at an area where the first opposite electrode 141 and the first common layer 131 are in direct contact with each other, and these electrons may flow to the first pixel electrode 101 and generate a leakage current. However, according to embodiments of the present disclosure, the first common layer 131 is disconnected at the boundary between the barrier layer 120 and the pixel defining layer 110, and thus, electrons from the first opposite electrode 141 do not flow to the first common layer 131. Accordingly, leakage current may be prevented or substantially reduced.

Hereinafter, a method of manufacturing the organic light-emitting display device 1 shown in FIG. 1 will be described with reference to FIGS. 2-7.

Figure 2:
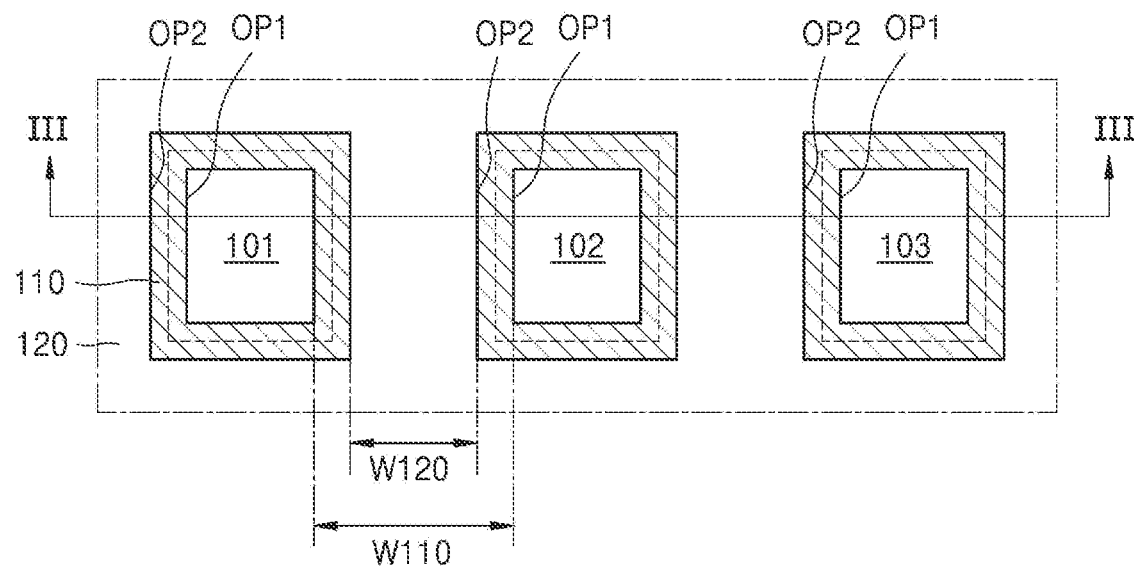
FIG. 2 is a schematic plan view of some elements of the organic light-emitting display device shown in FIG. 1.
Figure 3:
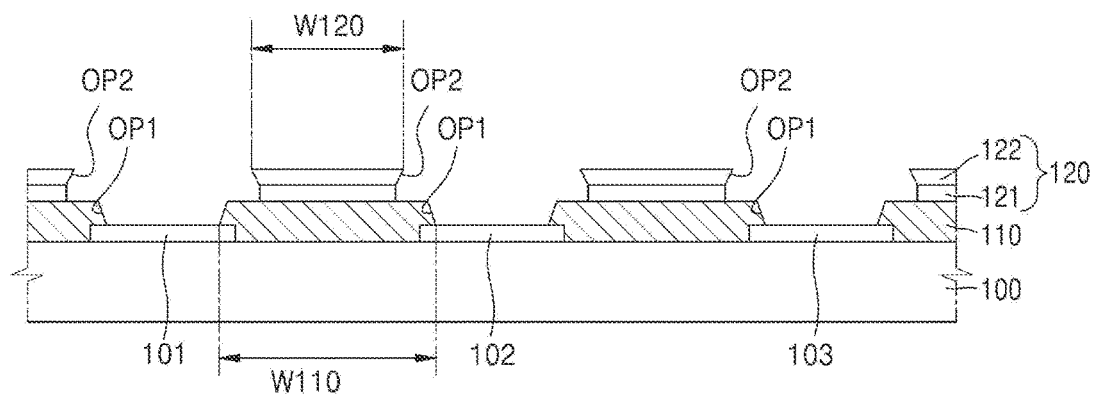
FIG. 3 is a schematic cross-sectional view taken along the line III-III of FIG. 2.

FIG. 2 is a schematic plan view of some elements of the organic light-emitting display device 1. FIG. 3 is a schematic cross-sectional view taken along the line III-III of FIG. 2. FIGS. 4A-4F are schematic cross-sectional views of a first unit process for manufacturing the organic light-emitting display device 1 according to an embodiment of the present disclosure. FIGS. 5A-5F are schematic cross-sectional views of a second unit process for manufacturing the organic light-emitting display device 1 according to an embodiment of the present disclosure. FIGS. 6A-6F are schematic cross-sectional views of a third unit process for manufacturing the organic light-emitting display device 1 according to an embodiment of the present disclosure. FIG. 7 is a schematic cross-sectional view of a pixel of the organic light-emitting display panel including a common electrode formed after the third unit process.

Referring to FIGS. 2 and 3, the first pixel electrode 101, a second pixel electrode 102, and a third pixel electrode 103 are formed on the substrate 100.

A buffer layer may be further formed on the substrate 100 (e.g., may be formed on the substrate 100 below the first through third pixel electrodes 101, 102, and 103) to provide a relatively smooth surface and to block penetration of impurities into the display device. For example, the buffer layer may be formed of silicon nitride, silicon oxide, and/or the like, as a single layer or a plurality of layers.

The first through third pixel electrodes 101, 102, and 103 are hole injection electrodes as described above and may be formed of a material having a high work function.

First through third thin film transistors may be arranged between the substrate 100 and the first through third pixel electrodes 101, 102, and 103 and are respectively electrically connected to the first through third pixel electrodes 101, 102, and 103.

The pixel defining layer 110 is formed to cover edges of the first through third pixel electrodes 101, 102 and 103 and to have first openings OP1 that expose center portions of the first through third pixel electrodes 101, 102 and 103. While the first openings OP1 illustrated in FIG. 3 have the same size, this is an example, and the sizes of the first openings OP1 may vary by pixel.

The barrier layer 120 including the first barrier layer 121 and the second barrier layer 122 is arranged on the pixel defining layer 110. The second barrier layer 122 has second openings OP2 that are larger than the corresponding first openings OP1 in the pixel defining layer 110. For example, a width W120 of the barrier layer 120 between two adjacent second openings OP2 is smaller than a width W110 of the pixel defining layer 110 between two adjacent first openings OP1.

The second barrier layer 122 is formed to have an undercut structure (e.g., an undercut-shaped structure). The first barrier layer 121 and the second barrier layer 122 may be formed of an inorganic insulating film or an organic insulating film, and the second openings OP2 in the second barrier layer 122 may be formed to have the undercut structure by controlling materials and etching conditions of the second barrier layer 122. The undercut structure affects deposition conditions of first through third intermediate layers 130-1, 130-2, and 130-3 and first through third opposite electrodes 141, 142, and 143 formed later.

Figure 4A:
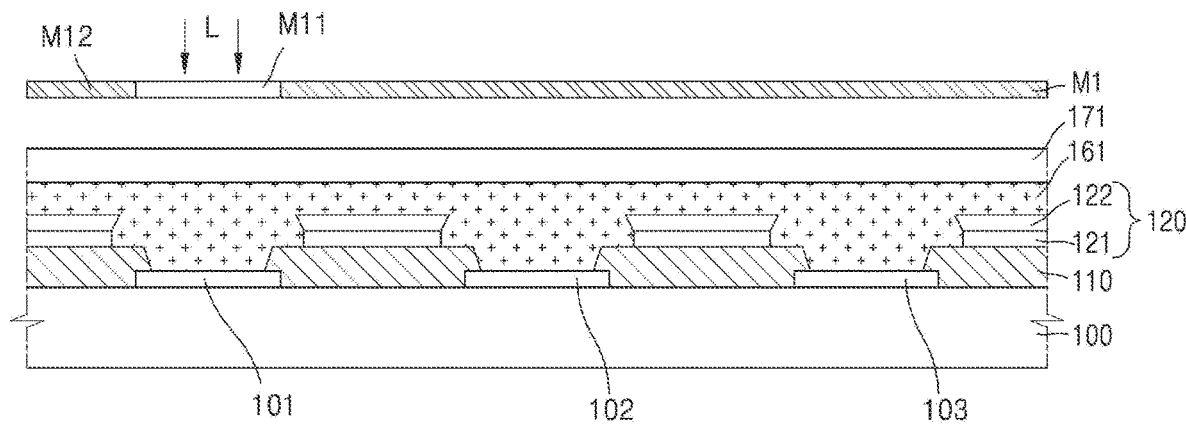
FIGS. 4A-4F are schematic cross-sectional views of a first unit process for manufacturing the organic light-emitting display device shown in FIG. 1 according to an embodiment of the present disclosure.

Referring to FIG. 4A, a first lift-off layer 161 and a first photoresist 171 are sequentially formed on the structure shown in FIG. 3.

The first lift-off layer 161 includes a fluoropolymer. The fluoropolymer included in the first lift-off layer 161 may be formed of a polymer having a fluorine content in a range of about 20 wt % to about 60 wt %. For example, the fluoropolymer included in the first lift-off layer 161 may include at least one selected from the group consisting of polytetrafluoroethylene, polychlorotrifluoroethylene, polydichlorodifluoroethylene, a copolymer of chlorotrifluoroethylene and dichlorodifluoroethylene, a copolymer of tetrafluoroethylene and perfluoroalkylvinylether, a copolymer of chlorotrifluoroethylene and perfluoroalkylvinylether, a copolymer of tetrafluoroethylene and perfluoroalkylvinylether, a copolymer of perfluoroalkyl vinyl ether and perfluoroalkyl vinyl ether, a copolymer of tetrafluoroethylene and perfluoroalkyl vinyl ether, or a copolymer of chlorotrifluoroethylene and perfluoroalkyl vinyl ether. The first lift-off layer 161 may be formed by using a coating method, a printing method, a deposition method, or the like.

The first photoresist 171 is formed on the first lift-off layer 161. The first photoresist 171 is exposed (e.g., developed) through a light transmitting portion M11 of a first photomask M1 at a position corresponding to the first pixel electrode 101. The first photomask M1 includes the light transmitting portion M11 and a light blocking portion M12.

Figure 4B:
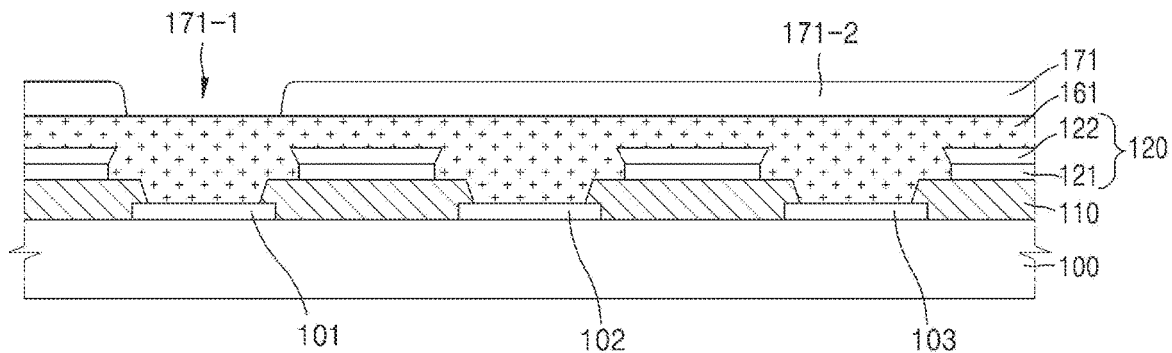

Referring to FIG. 4B, the first photoresist 171 is developed. The first photoresist 171 may be either a positive type or a negative type. Hereinafter, a positive type photoresist will be described as an example. A first portion 171-1 of the photoresist 170 corresponding to the first pixel electrode 101 and the light transmitting portion M11 of the first photomask M1 is removed from the first photoresist 171 during the exposure (e.g., during the development) and the remaining portion (e.g., a second portion 171-2 of the photoresist 170) remains.

Figure 4C:
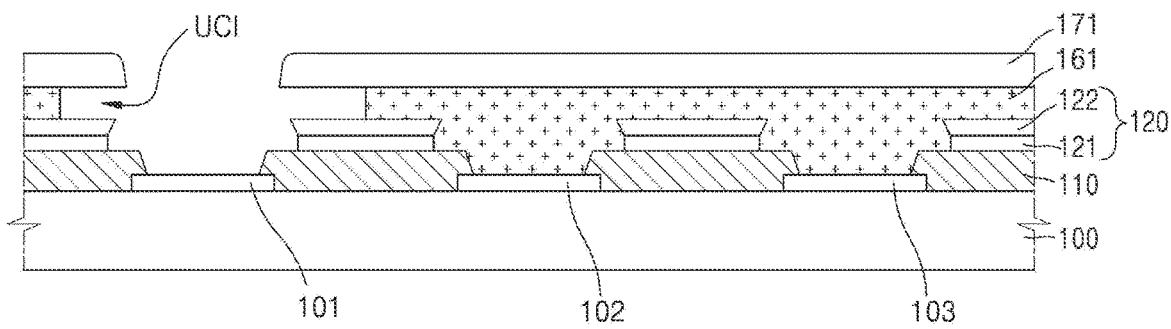

Referring to FIG. 4C, the first lift-off layer 161 is etched according to a pattern of the first portion 171-1 of the first photoresist 171 shown in FIG. 4B by using the photoresist 171 as an etching mask.

The first lift-off layer 161 includes a fluoropolymer, and thus, a solvent capable of etching the fluoropolymer is used as an etching solution. A first solvent may include hydrofluoroether. Hydrofluoroether is an electrochemically stable material due to its low interaction with other materials and is environmentally stable due to its low global warming potential and low toxicity.

A portion of the first lift-off layer 161 at a position corresponding to the first portion 171-1, that is, a portion of the first lift-off layer 161 formed on the first pixel electrode 101, is etched by the etching process. When the first lift-off layer 161 is etched, the first solvent including fluorine forms a first undercut profile UC1 under the first portion 171-1 of the first photoresist 171 (e.g., under an interface of the first portion 171-1 of the first photoresist 171 and the first lift-off layer 161).

Figure 4D:
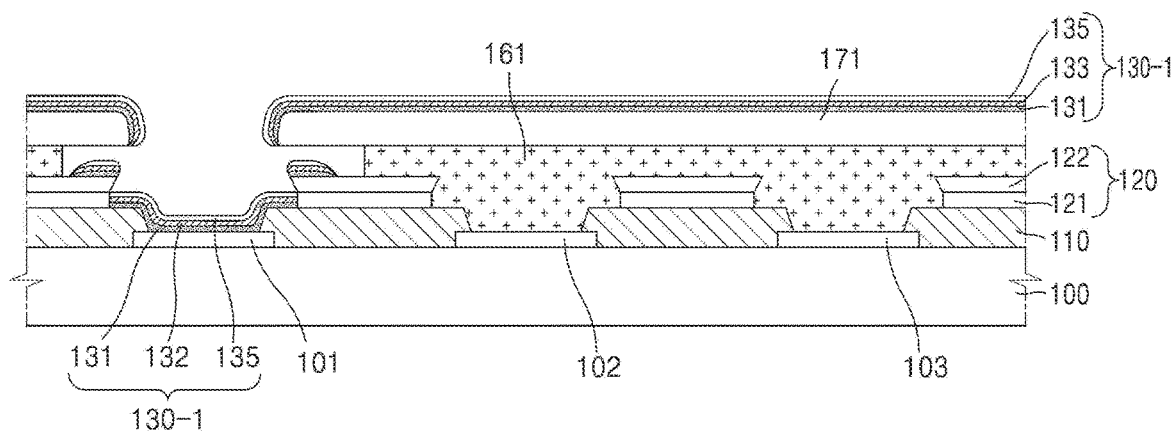

Referring to FIG. 4D, the first intermediate layer 130-1 including the first common layer 131, the first emissive layer 132, and the second common layer 135 is formed on the structure shown in FIG. 4C.

The first common layer 131, the first emissive layer 132, and the second common layer 135 are each formed by vacuum deposition. The first common layer 131, the first emissive layer 132, and the second common layer 135 are sequentially formed by controlling an angle of incidence of deposition of a deposition material discharged from a deposition source toward the substrate 100.

The first common layer 131, the first emissive layer 132, and the second common layer 135 are sequentially stacked on the first pixel electrode 101, the pixel defining layer 110, and the barrier layer 120. The first common layer 131, the first emissive layer 132, and the second common layer 135 are also stacked on the first photoresist 171.

Because the first lift-off layer 161 and the first photoresist 171, which together form the undercut structure UC1, function as a mask, the first common layer 131, the first emissive layer 132, and the second common layer 135 are not uniformly deposited but are deposited with a gradually decreasing thickness towards end portions thereof on the second barrier layer 122.

In the illustrated embodiment, the first common layer 131, the first emissive layer 132, and the second common layer 135 are disconnected from themselves at a boundary between the barrier layer 120 and the pixel defining layer 110.

Figure 4E:
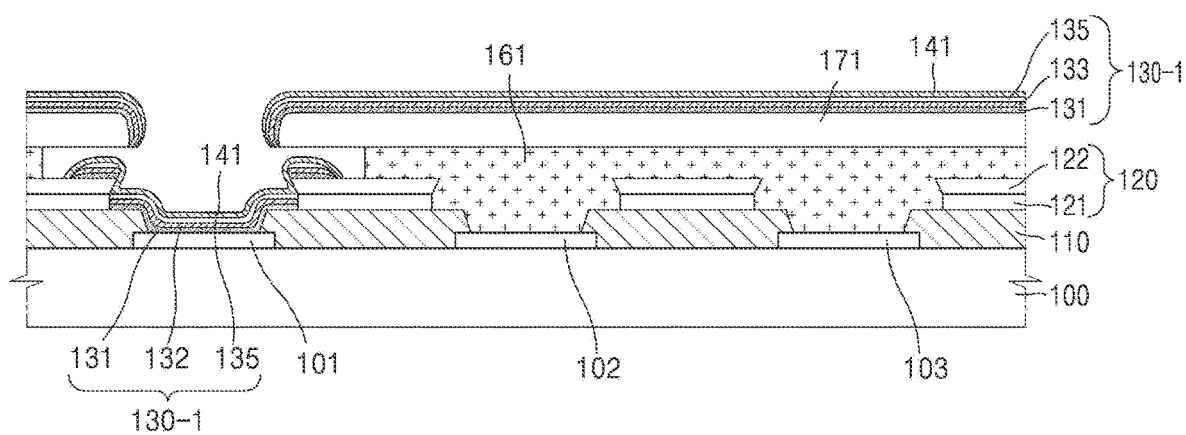

Referring to FIG. 4E, the first opposite electrode 141 is formed by vacuum deposition on the structure shown in FIG. 4D.

The first opposite electrode 141 is deposited to completely cover the first intermediate layer 130-1, which includes the first common layer 131, the first emissive layer 132, and the second common layer 135, by adjusting an angle of incidence of deposition at which a deposition material discharged from a deposition source is incident toward the substrate 100. For example, the first opposite electrode 141 is formed to have a greater area than the first intermediate layer 130-1. As described above, because the first opposite electrode 141 completely covers the first intermediate layer 130-1, damage to the first intermediate layer 130-1, including the first emissive layer 132, due to the first solvent used in a lift-off operation, which will be further described later, may be prevented or substantially reduced.

Figure 4F:
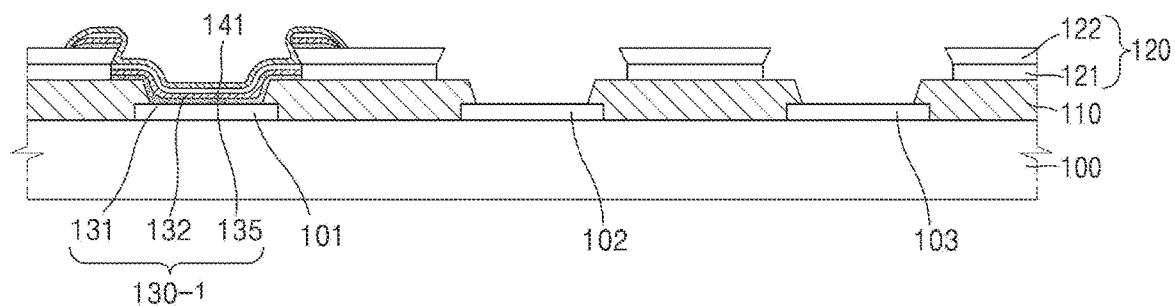

Referring to FIG. 4F, the lift-off operation is performed to the structure of FIG. 4D.

The first lift-off layer 161 includes a fluoropolymer, and thus, the first lift-off layer 161 is removed by using a second solvent including fluorine. Because the lift-off operation is performed after forming the first intermediate layer 130-1, which includes the first emissive layer 132, a material having low reactivity with the first intermediate layer 130-1 may be used as the second solvent. The second solvent may include hydrofluoroether, similar to the first solvent.

After the lift-off operation, the first intermediate layer 130-1 and the first opposite electrode 141 are left as patterns on the first pixel electrode 101, the pixel defining layer 110, and the barrier layer 120.

After performing the above-described first unit process, a second unit process including forming a second emissive layer 133 that emits light having a different color from the first emissive layer 132 is performed in an area where the second pixel electrode 102 is located. Like reference numerals may represent like structures, and the below description of the second unit process will primarily focus on differences from the above-described first unit process.

Figure 5A:
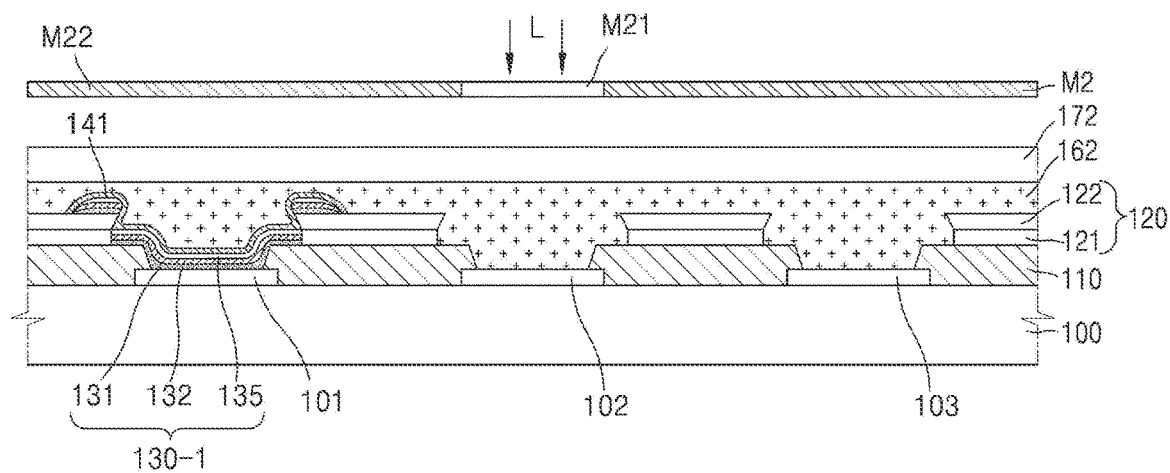
FIGS. 5A-5F are schematic cross-sectional views of a second unit process for manufacturing the organic light-emitting display device shown in FIG. 1 according to an embodiment of the present disclosure.

Referring to FIG. 5A, a second lift-off layer 162 and a second photoresist 172 are sequentially formed on the structure shown in FIG. 4F.

The second lift-off layer 162 includes a fluoropolymer and may be formed of a same or a substantially similar material as the first lift-off layer 161 described above.

The second photoresist 172 is formed on the second lift-off layer 162, and a portion of the second photoresist 172 at a position corresponding to the second pixel electrode 102 is exposed through a light-transmitting portion M21 of a second photomask M2, which includes the light-transmitting portion M21 and a light-blocking portion M22.

Figure 5B:
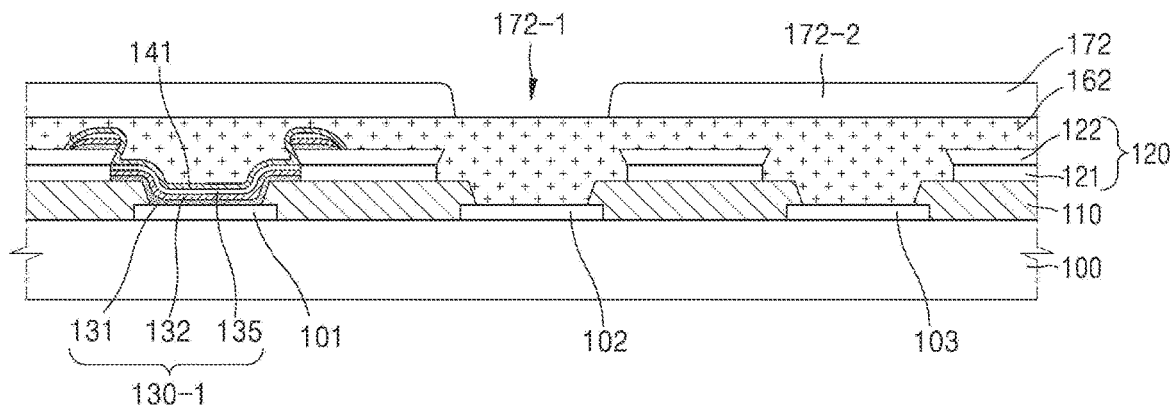

Referring to FIG. 5B, the second photoresist 172 is developed. After the second photoresist 172 is developed, a first portion 172-1 corresponding to the second pixel electrode 102 is removed from the second pixel electrode 102, and the remaining portion (e.g., a second portion 172-2) remains.

Figure 5C:
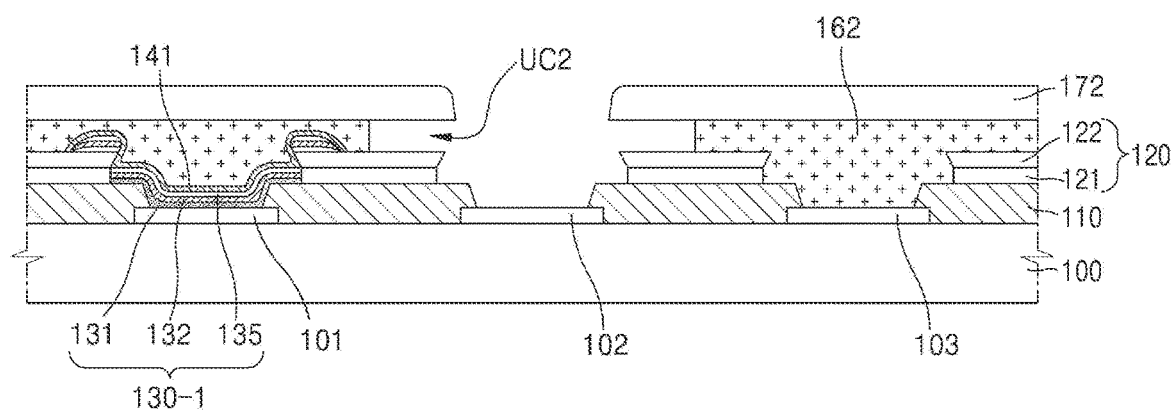

Referring to FIG. 5C, the second lift-off layer 162 is etched by using a pattern of the first portion 172-1 of the second photoresist 172 of FIG. 5B as an etching mask.

The second lift-off layer 162 may be etched by using the first solvent including fluorine. The second lift-off layer 162 formed at a position corresponding to the first portion 172-1, that is, a portion of the second lift-off layer 162 formed on the second pixel electrode 102 is etched by an etching process. When the second lift-off layer 162 is etched, the first solvent including fluorine forms a second undercut profile UC2 under the first portion 172-1 of the second photoresist 172 (e.g., under an interface of the first portion 172-1 of the second photoresist 172 and the second lift-off layer 162).

Figure 5D:
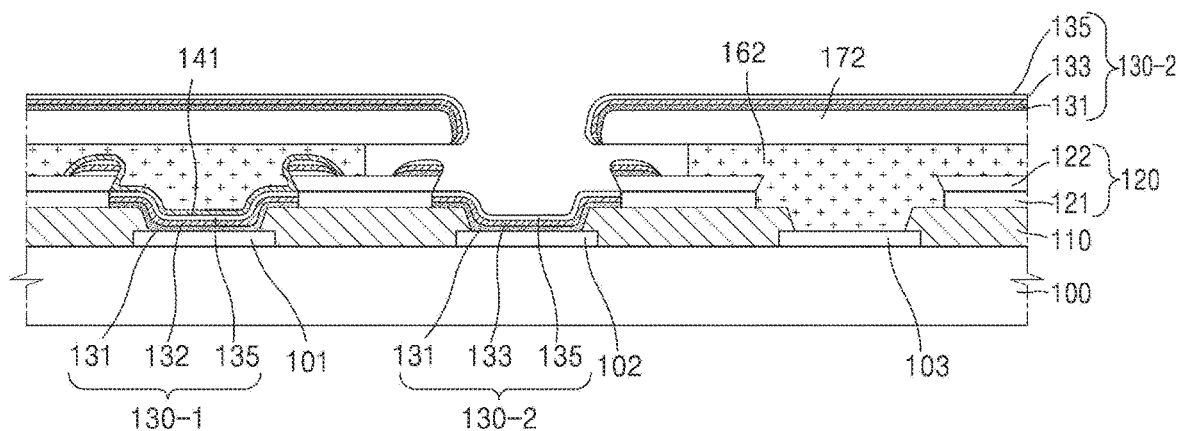

Referring to FIG. 5D, the second intermediate layer 130-2, which includes the first common layer 131, the second emissive layer 133, and the second common layer 135, is formed on the structure shown in FIG. 5C.

The first common layer 131, the second emissive layer 133, and the second common layer 135 are each formed by vacuum deposition. The first common layer 131, the second emissive layer 133, and the second common layer 135 are sequentially formed by controlling an angle of incidence of deposition of a deposition material discharged from a deposition source toward the substrate 100.

The first common layer 131, the second emissive layer 133, and the second common layer 135 are sequentially stacked on the second pixel electrode 102, the pixel defining layer 110, and the barrier layer 120. The first common layer 131, the second emissive layer 133, and the second common layer 135 are also stacked on the second photoresist 172.

Because the second lift-off layer 162 and the second photoresist 172, which together form the second undercut structure UC2, function as a mask, the first common layer 131, the second emissive layer 133, and the second common layer 135 are not uniformly deposited but are deposited with a gradually decreasing thickness towards end portions thereof on the second barrier layer 122.

In the illustrated embodiment, the first common layer 131, the second emissive layer 133, and the second common layer 135 are formed to be disconnected from themselves at the boundary between the barrier layer 120 and the pixel defining layer 110.

Figure 5E:
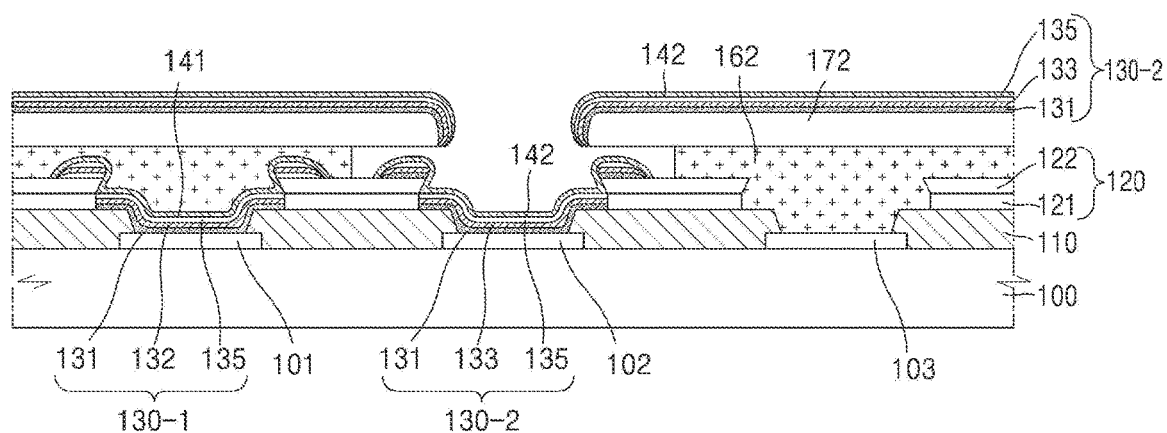

Referring to FIG. 5E, the second opposite electrode 142 is formed by vacuum deposition on the structure shown in FIG. 5D.

The second opposite electrode 142 is deposited to completely cover the second intermediate layer 130-2, which includes the first common layer 131, the second emissive layer 133, and the second common layer 135, by adjusting an angle of deposition and incidence at which a deposition material discharged from a deposition source is incident toward the substrate 100. For example, the second opposite electrode 142 is formed to have a larger area than the second intermediate layer 130-2. As described above, because the second opposite electrode 142 completely covers the second intermediate layer 130-2, damage to the second intermediate layer 130-2, which includes the second emissive layer 133, due to the first solvent used in a lift-off operation, which will be further described later, may be prevented or substantially reduced.

Figure 5F:
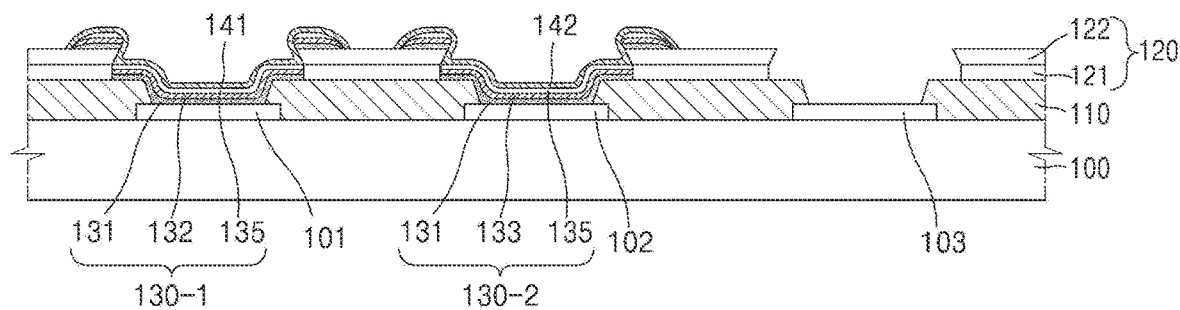

Referring to FIG. 5F, the lift-off operation is performed on the structure shown in FIG. 5D.

The second lift-off layer 162 is removed by using the second solvent including fluorine.

After the lift-off operation, the second intermediate layer 130-2 and the second opposite electrode 142 are left as patterns on the second pixel electrode 102, the pixel defining layer 110, and the barrier layer 120, together with the patterns of the first intermediate layer 130-1 and the first opposite electrode 141 formed in the first unit process.

After performing the second unit process described above, a third unit process of forming a third emissive layer 134 that emits light having a different color from the first emissive layer 132 and the second emissive layer 133 is performed in an area where the third pixel electrode 103 is located. Like reference numerals may represent like structures, and the description of the third unit process will primarily focus on differences from the above-described first unit process.

Figure 6A:
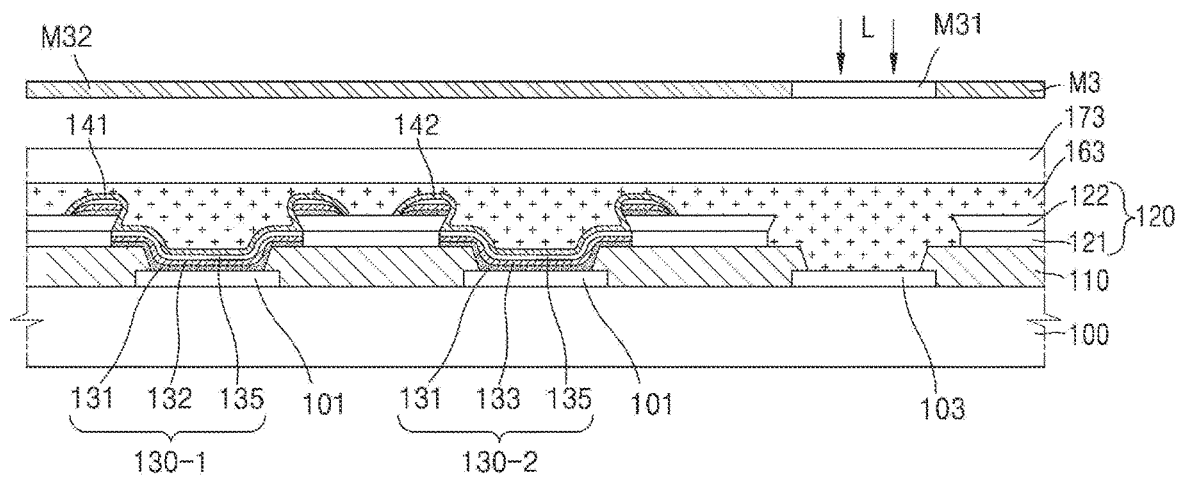
FIGS. 6A-6F are schematic cross-sectional views of a third unit process for manufacturing the organic light-emitting display device according to an embodiment of the present disclosure.
Figure 7:
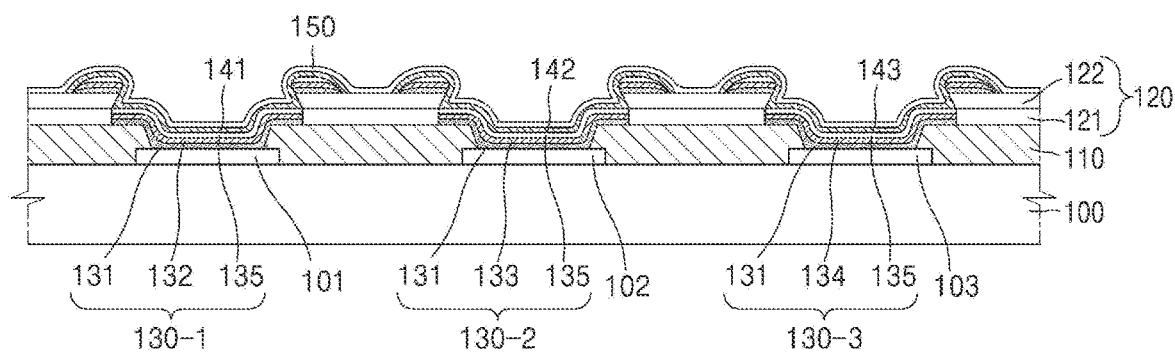
FIG. 7 is a schematic cross-sectional view of a portion of the organic light-emitting display device including a common electrode formed after the third unit process.

Referring to FIG. 6A, a third lift-off layer 163 and a third photoresist 173 are sequentially formed on the structure shown in FIG. 5F.

The third lift-off layer 163 includes a fluoropolymer and may be formed of a same or a substantially similar material as the first lift-off layer 161 described above.

The third photoresist 173 is formed on the third lift-off layer 163, and a portion of the third photoresist 173 at a position corresponding to the third pixel electrode 103 is exposed through a light-transmitting portion M31 of a third photomask M3, which includes the light-transmitting portion M31 and a light-blocking portion M32.

Figure 6B:
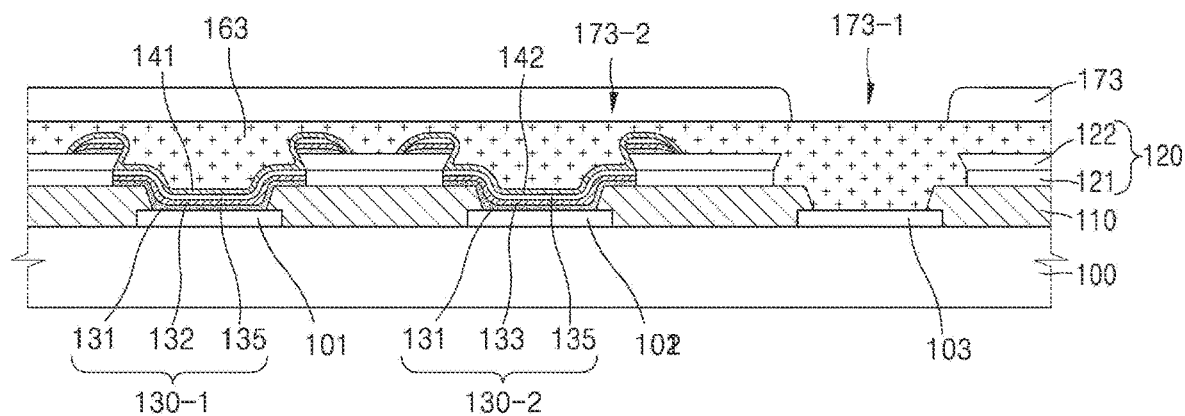

Referring to FIG. 6B, the third photoresist 173 is developed. After the third photoresist 173 is developed, a first portion 173-1 corresponding to third pixel electrode 103 is removed from the third photoresist 173, and the remaining portion (e.g., a second portion 173-2) remains.

Figure 6C:
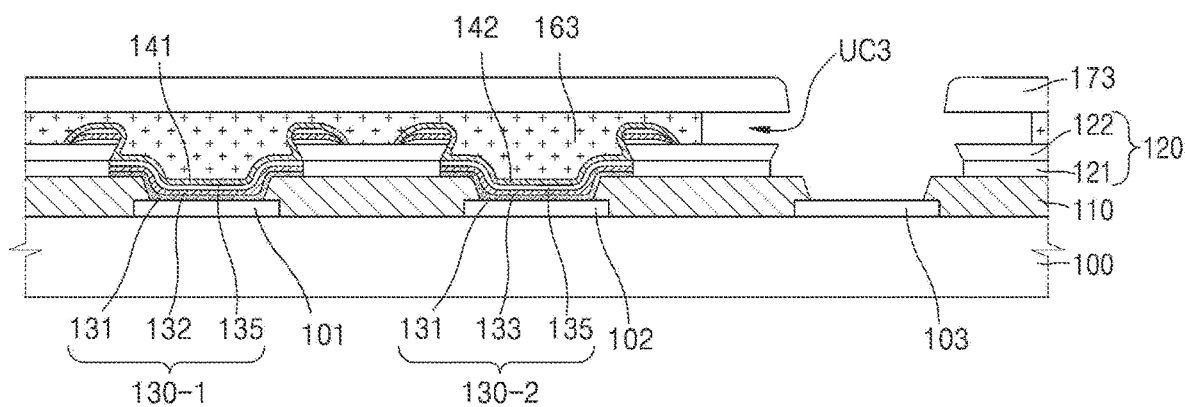

Referring to FIG. 6C, the third lift-off layer 163 is etched by using a pattern of the first portion 173-1 of the third photoresist 173 shown in FIG. 6B as an etching mask.

The third lift-off layer 163 may be etched by using the first solvent including fluorine. The third lift-off layer 163 formed at a position corresponding to the first portion 173-1, that is, a portion of the third lift-off layer 163 formed on the third pixel electrode 103, is etched by an etching process. When the third lift-off layer 163 is etched, the first solvent including fluorine forms a third undercut profile UC3 under the first portion 173-1 of the third photoresist 173 (e.g., under an interface of the first portion 173-1 of the third photoresist 173 and the third lift-off layer 163).

Figure 6D:
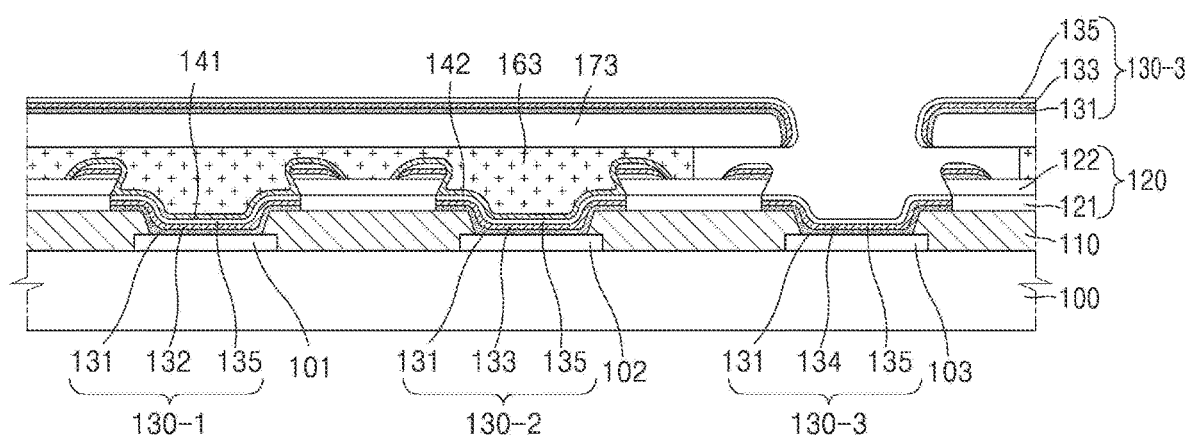

Referring to FIG. 6D, the third intermediate layer 130-3, which includes the first common layer 131, the third emissive layer 134, and the second common layer 135, is formed on the structure shown in FIG. 6C.

The first common layer 131, the third emissive layer 134, and the second common layer 135 are each formed by vacuum deposition. The first common layer 131, the third emissive layer 134, and the second common layer 135 are sequentially formed by controlling an angle of incidence of deposition of a deposition material discharged from a deposition source toward the substrate 100.

The first common layer 131, the third emissive layer 134, and the second common layer 135 are sequentially stacked on the third pixel electrode 103, the pixel defining layer 110, and the barrier layer 120. The first common layer 131, the third emissive layer 134, and the second common layer 135 are also stacked on the third photoresist 173.

Because the third lift-off layer 163 and the third photoresist 173, which together form the third undercut structure UC3, function as a mask, the first common layer 131, the third emissive layer 134, and the second common layer 135 are not uniformly deposited but are deposited with a gradually decreasing thickness towards end portions thereof on the second barrier layer 122.

The first common layer 131, the third emissive layer 134, and the second common layer 135 are formed to be disconnected from themselves at the boundary between the barrier layer 120 and the pixel defining layer 110.

Figure 6E:
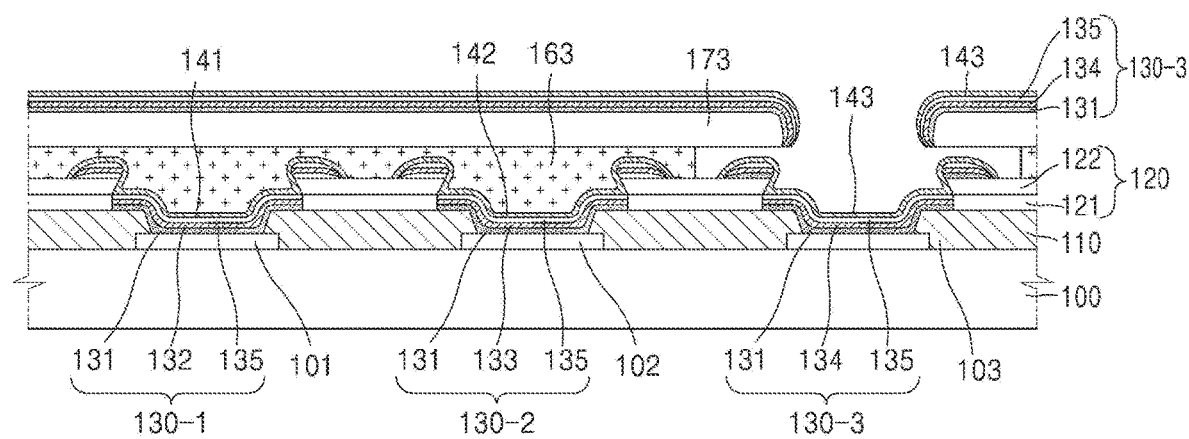

Referring to FIG. 6E, a third opposite electrode 143 is formed by vacuum deposition on the structure shown in FIG. 6D.

The third opposite electrode 143 is deposited to completely cover the third intermediate layer 130-3, which includes the first common layer 131, the third emissive layer 134, and the second common layer 135, by adjusting an angle of deposition and incidence at which a deposition material discharged from a deposition source is incident toward the substrate 100. For example, the third opposite electrode 144 is formed to have a larger area than the third intermediate layer 130-3. As described above, because the third opposite electrode 143 completely covers the third intermediate layer 130-3, damage to the third intermediate layer 130-3, which includes the third emissive layer 134, due to the first solvent used in a lift-off operation, which will be further described later, may be prevented or substantially reduced.

Figure 6F:
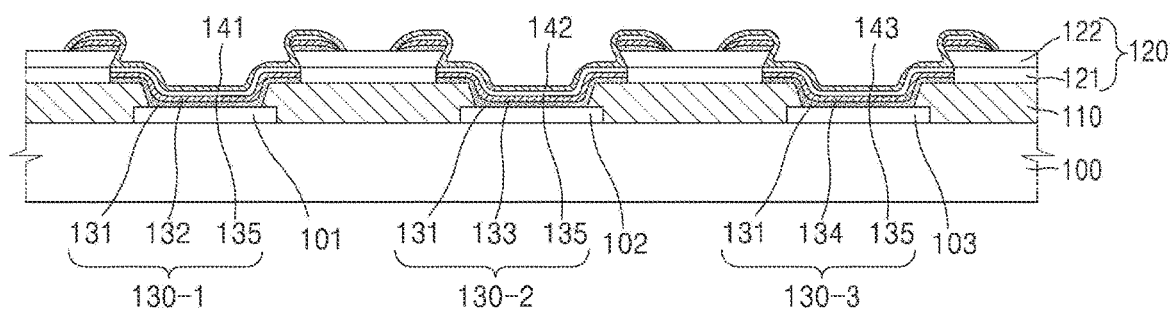

Referring to FIG. 6F, the lift-off operation is performed on the structure shown in FIG. 6D.

The third lift-off layer 163 is removed by using the second solvent including fluorine.

After the lift-off operation, the third intermediate layer 130-3 and the third opposite electrode 143 are left as patterns on the third pixel electrode 103, the pixel defining layer 110, and the barrier layer 120, together with the patterns of the first intermediate layer 130-1 and the first opposite electrode 141 formed in the first unit process and the patterns of the second intermediate layer 130-2 and the second opposite electrode 142 formed in the second unit process.

Referring to FIG. 7, a common electrode 150 is formed on the structure shown in FIG. 6F. The common electrode 150 is integrally (e.g., continuously) formed to cover all of the first through third opposite electrodes 141, 142, and 143.

The first emissive layer 132 emits light having a first color, the second emissive layer 133 emits light having a second color, and the third emissive layer 134 emits light having a third color. For example, the first color may be red, the second color may be green, and the third color may be blue. A full-color organic light-emitting display device may be manufactured by the above-described first through third unit processes.

An encapsulation member encapsulating the organic light-emitting element may be further included on the common electrode 150. The encapsulation member may be formed of a glass substrate, a metal foil, a thin film encapsulation layer in which an inorganic layer and an organic layer are mixed or stacked, or the like.

In the illustrated embodiment, instead of depositing the patterns of the first intermediate layer 130-1 and the first opposite electrode 141, the second intermediate layer 130-2 and the second opposite electrode 142, and the third intermediate layer 130-3 and the third opposite electrode 143 by using a fine metal mask as in conventional examples, these patterns are formed by using the above-described lift-off operations. Thus, misalignment between the substrate 100 and the fine metal mask may be avoided because a fine metal mask is not needed. Thus, the manufacturing costs may be reduced.

In addition, in the illustrated embodiment, the first common layer 131 is disconnected at the boundary between the barrier layer 120 and the pixel defining layer 110 in each pixel, and thus, flow of electrons from the first opposite electrode 141 to the first common layer 131 outside of the pixel area is prevented or substantially reduced. Thereby, leakage current may be prevented or substantially reduced.

Hereinafter, an organic light-emitting display device 5 according to a comparative example which does not include the barrier layer having the undercut structure as in the above-described embodiments of the present disclosure will be described with reference to FIGS. 8A, 8B, and 9.

Figure 8A:
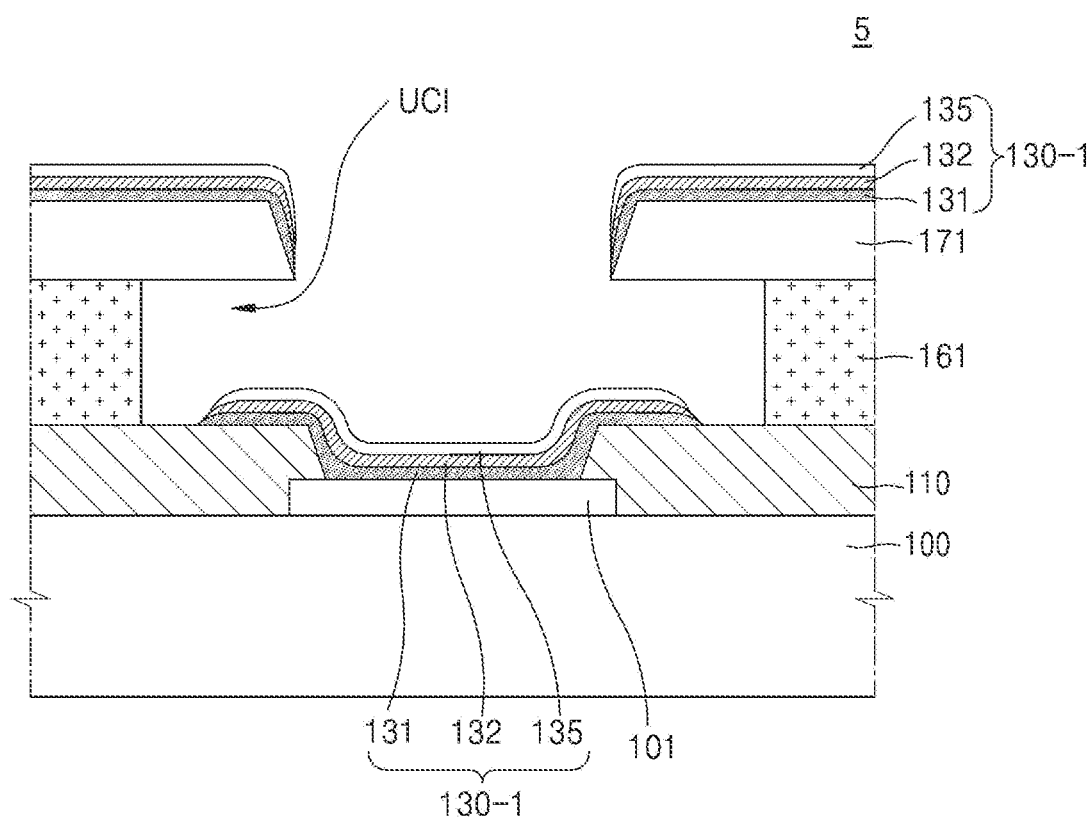
FIGS. 8A and 8B are schematic cross-sectional views of a process for manufacturing an organic light-emitting display device according to a comparative example.
Figure 8B:
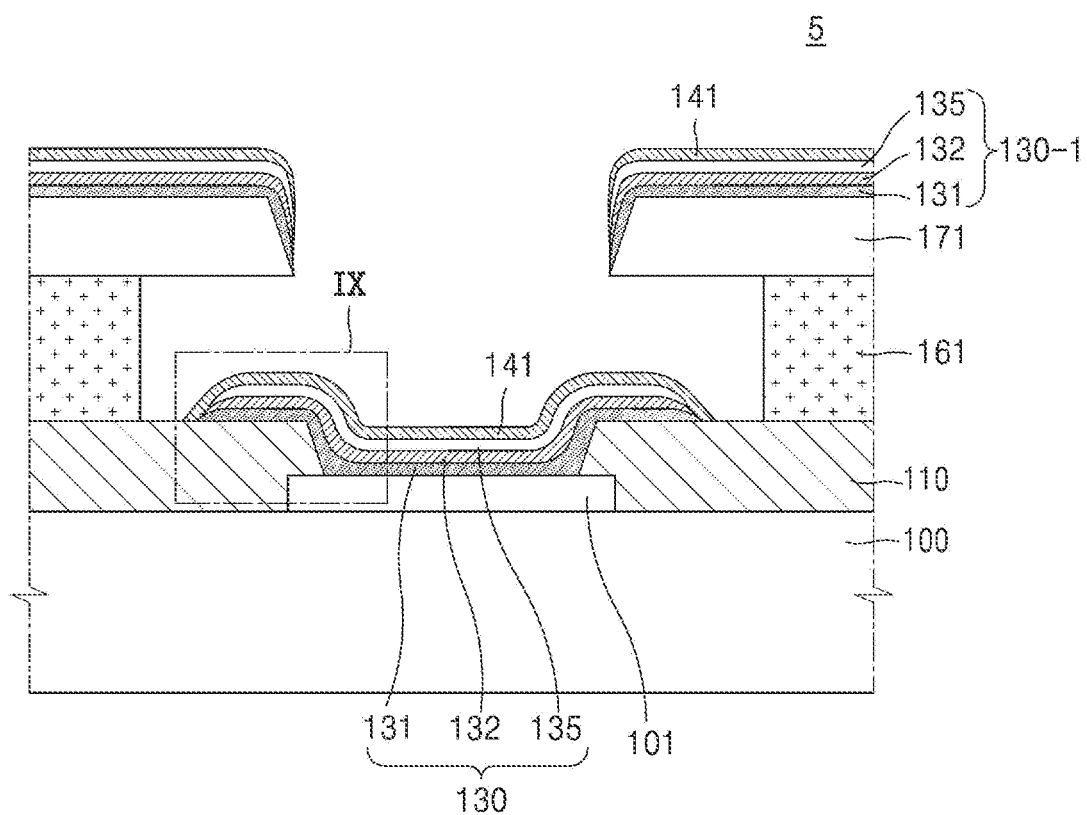
Figure 9:
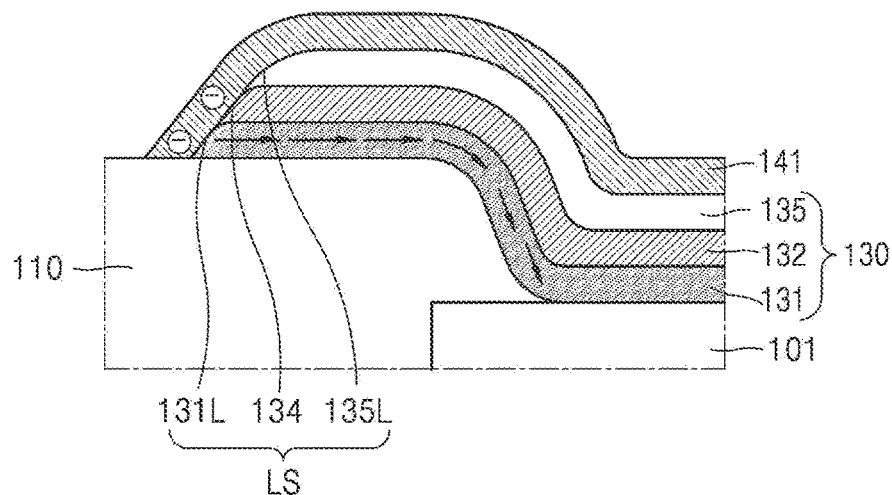
FIG. 9 is an enlarged cross-sectional view of the portion IX of FIG. 8B.

FIGS. 8A and 8B are schematic cross-sectional views illustrating a process of manufacturing the organic light-emitting display device 5 according to the comparative example, and FIG. 9 is an enlarged cross-sectional view of the portion IX of FIG. 8B.

FIG. 8A illustrates a first unit process of the comparative example in which a first lift-off layer 161 and a first photoresist 171, which together form a first undercut structure, are used as a mask to deposit a first intermediate layer 130-1, which includes a first common layer 131, a first emissive layer 132, and a second common layer 135, on a first pixel electrode 101 and a pixel defining layer 110.

The organic light-emitting display device 5 according to the comparative example does not include the barrier layer 120 (see, e.g., FIG. 1) unlike the above-described embodiments of the present disclosure.

Because the first lift-off layer 161 and the first photoresist 171 function as a mask, the first common layer 131, the first emissive layer 132, and the second common layer 135 are not uniformly deposited on edges of a deposition area; they are instead deposited with a gradually decreasing thickness on the pixel defining layer 110 towards the edges of the deposition area.

FIG. 8B illustrates the first opposite electrode 141 that is formed on the structure shown in FIG. 8A through vacuum deposition. The first opposite electrode 141 is deposited to completely cover the first intermediate layer 130-1 by controlling an angle of deposition and incidence of a deposition material discharged from a deposition source toward the substrate 100.

When formed under the same or substantially similar deposition conditions as the first intermediate layer 130-1 and the first opposite electrode 141 of the above-described embodiments of the present disclosure, the first opposite electrode 141 of the comparative example is on the pixel defining layer 110 and contacts an edge 131-L of the first common layer 131 (see, e.g., FIG. 9), an edge 132-L of the first emissive layer 132, and an edge 135-L of the second common layer 135. Electrons from the first opposite electrode 141 flow to the first common layer 131, the first emissive layer 132, and the second common layer 135 through these contact areas and, particularly, to the first pixel electrode 101 along the first common layer 131. Accordingly, leakage current may be generated.

Ideally, current does not flow in the organic light-emitting device before a driving voltage reaches a threshold voltage. However, in the comparative example, electrons from the first opposite electrode 141 flow to the first common layer 131 in a region where the first opposite electrode 141 and the first common layer 131 are in direct contact with each other, and these electrons may flow to the first pixel electrode 101 to generate leakage current.

According to embodiments of the present disclosure, the barrier layer 120 arranged on the pixel defining layer 110 has the undercut structure, and thus, the first common layer 131 is disconnected at the boundary between the barrier layer 120 and the pixel defining layer 110. Thus, electrons from the first opposite electrode 141 do not flow to the first common layer 131 outside of the pixel area. Accordingly, leakage current may be prevented or substantially reduced.

Hereinafter, other embodiments of the present disclosure will be described with reference to FIGS. 10-12. The description of the following embodiments of the present disclosure will primarily focus on differences from the embodiments of the present disclosure described above.

Figure 10:
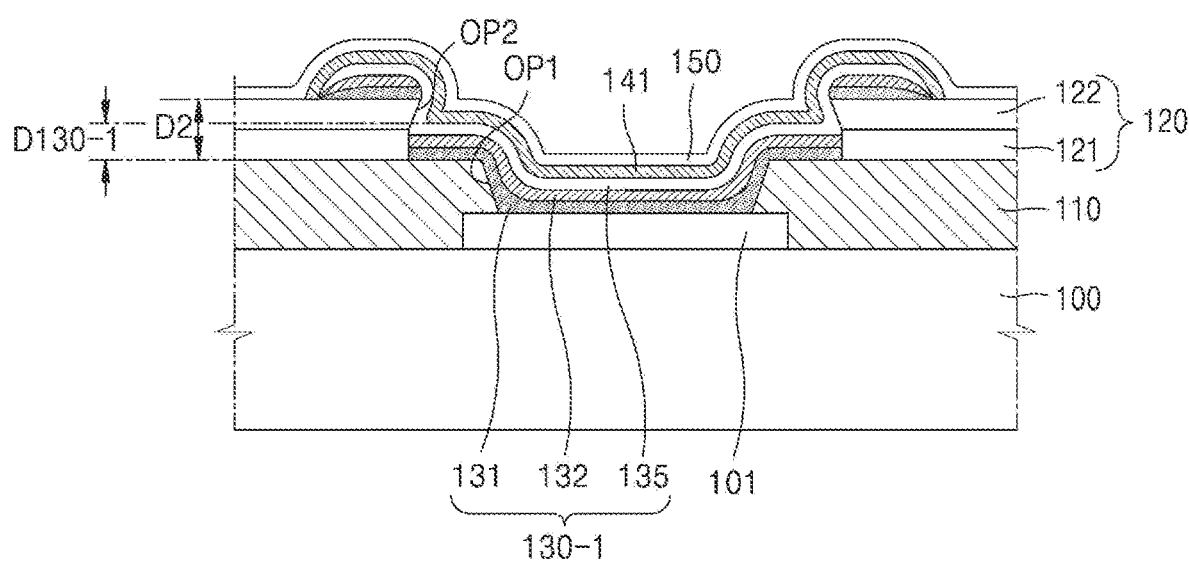
FIG. 10 is a schematic cross-sectional view of a portion of an organic light-emitting display device according to an embodiment of the present disclosure.

FIG. 10 is a schematic cross-sectional view of a portion of an organic light-emitting display device 2 according to an embodiment of the present disclosure.

Referring to FIG. 10, the organic light-emitting display device 2 includes a first pixel electrode 101 arranged on a substrate 100, a pixel defining layer 110 having a first opening OP1 exposing a center portion of the first pixel electrode 101, a barrier layer 120 arranged on the pixel defining layer 110 and having a second opening OP2 that is larger than the first opening OP1 and having an undercut structure, a first intermediate layer 130-1 arranged on the first pixel electrode 101, the pixel defining layer 110, and the barrier layer 120, a first opposite electrode 141 covering the first intermediate layer 130-1, and a common electrode 150 arranged on the first opposite electrode 141. The barrier layer 120 includes a first barrier layer 121 and a second barrier layer 122 having an undercut structure.

A total thickness D2 of the barrier layer 120 of this embodiment is less than a total thickness D1 of the barrier layer 120 described above in reference to FIG. 1. The total thickness D2 of the barrier layer 120 is greater than a thickness D130-1 of the first intermediate layer 130-1.

When the first intermediate layer 130-1 and the first opposite electrode 141 are deposited under the same or substantially similar conditions as in the embodiment illustrated in FIG. 1, the first common layer 131 and the first emissive layer 132 are disconnected at the boundary between the barrier layer 120 and the pixel defining layer 110, and the second common layer 135 and the first opposite electrode 141 are connected at the boundary between the barrier layer 120 and the pixel defining layer 110.

Similar to the embodiment shown in FIG. 1, the first common layer 131 of the embodiment illustrated in FIG. 10 is disconnected at the boundary between the barrier layer 120 and the pixel defining layer 110, and thus, electrons from the first opposite electrode 141 do not flow to the first common layer 131 outside the pixel area. Accordingly, leakage current may be prevented or substantially reduced.

Figure 11:
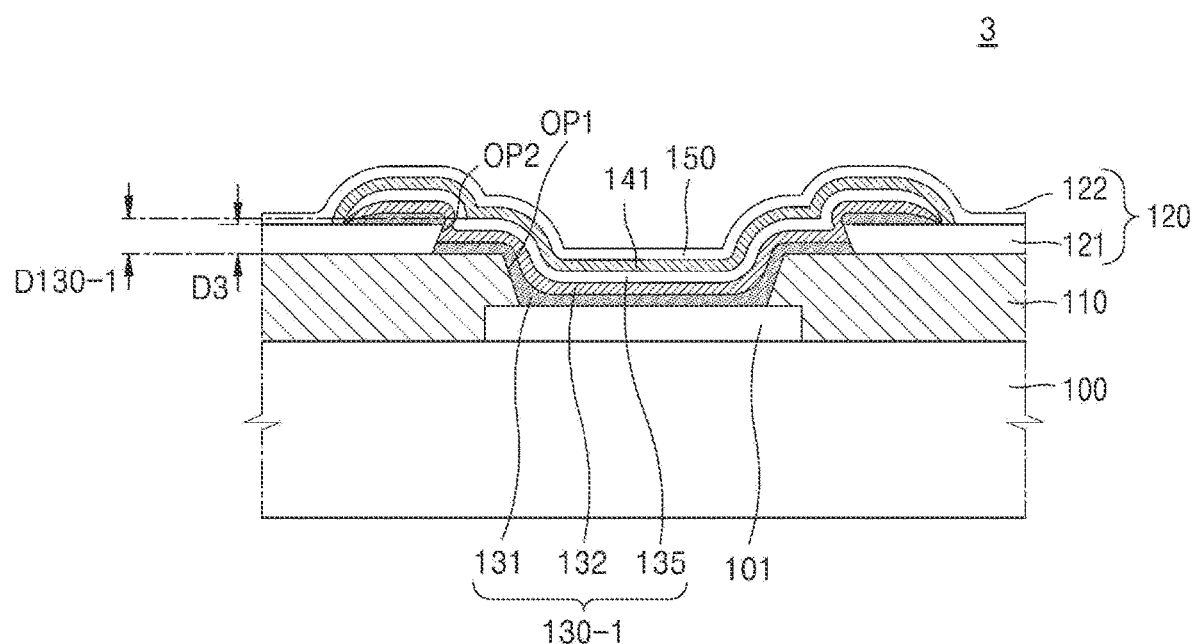
FIG. 11 is a schematic cross-sectional view of a portion of an organic light-emitting display device according to an embodiment of the present disclosure.

FIG. 11 is a schematic cross-sectional view of a portion of an organic light-emitting display device 3 according to an embodiment of the present disclosure.

Referring to FIG. 11, the organic light-emitting display device 3 includes a first pixel electrode 101 arranged on a substrate 100, a pixel defining layer 110 having a first opening OP1 exposing a center portion of the first pixel electrode 101, a barrier layer 120 arranged on the pixel defining layer 110 and having a second opening OP2 that is larger than the first opening OP1 and having an undercut structure, a first intermediate layer 130-1 arranged on the first pixel electrode 101, the pixel defining layer 110, and the barrier layer 120, a first opposite electrode 141 covering the first intermediate layer 130-1, and a common electrode 150 arranged on the first opposite electrode 141. The barrier layer 120 in this embodiment has a single-layer undercut structure.

A total thickness D3 of the barrier layer 120 in the embodiment illustrated in FIG. 11 is less than a total thickness D1 of the barrier layer 120 of the embodiment illustrated in FIG. 1. In addition, the total thickness D3 of the barrier layer 120 illustrated in FIG. 11 is less than a thickness D130-1 of the first intermediate layer 130-1. However, the total thickness D3 of the barrier layer 120 illustrated in FIG. 11 is greater than a thickness D131 of the first common layer 131.

When the first intermediate layer 130-1 and the first opposite electrode 141 are deposited under the same or substantially similar conditions as in the embodiment illustrated in FIG. 1, the first common layer 131 is disconnected at the boundary between the barrier layer 120 and the pixel defining layer 110 and the first emissive layer 132, the second common layer 135, and the first opposite electrode 141 are connected at the boundary between the barrier layer 120 and the pixel defining layer 110.

However, because the first common layer 131 is disconnected at the boundary between the barrier layer 120 and the pixel defining layer 110 in the embodiment illustrated in FIG. 11, similar to the embodiment illustrated in FIG. 1, electrons do not flow from the first opposite electrode 141 to the first common layer 131 outside the pixel area. Accordingly, leakage current may be prevented or substantially reduced.

Figure 12:
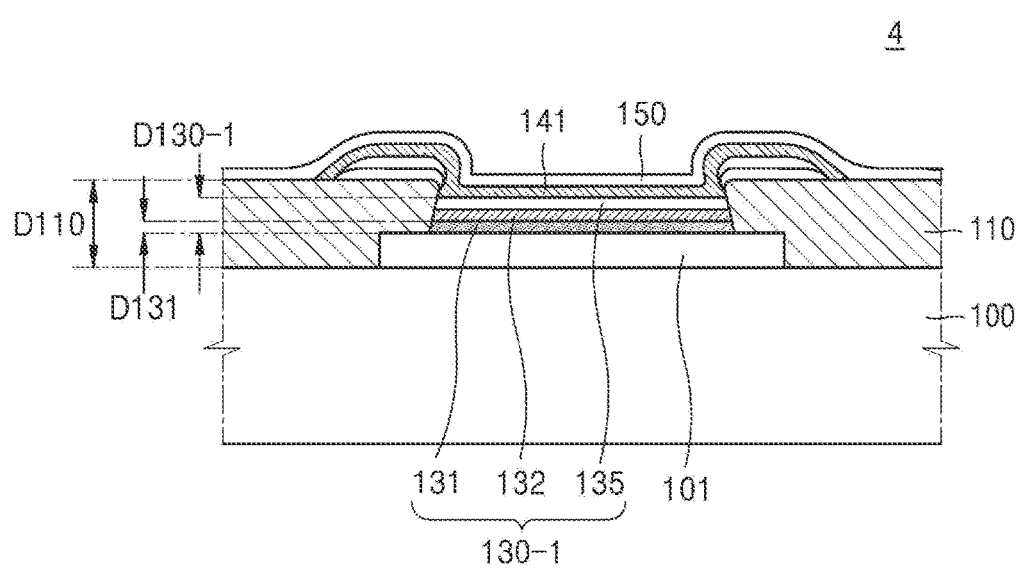
FIG. 12 is a schematic cross-sectional view of a portion of an organic light-emitting display device according to an embodiment of the present disclosure.

FIG. 12 is a schematic cross-sectional view of an organic light-emitting display device 4 according to an embodiment of the present disclosure.

Referring to FIG. 12, the organic light-emitting display device 4 includes a first pixel electrode 101 arranged on a substrate 100, a pixel defining layer 110 having a first opening OP1 exposing a center portion of the first pixel electrode 101, a first intermediate layer 130-1 arranged on the first pixel electrode 101 and the pixel defining layer 110, a first opposite electrode 141 covering the first intermediate layer 130-1, and a common electrode 150 arranged on the first opposite electrode 141.

Different from the above-described embodiments of the present disclosure, no barrier layer is included in the embodiment shown in FIG. 12 and the pixel defining layer 110 having an undercut structure is included.

A thickness D110 of the pixel defining layer 110 in the embodiment illustrated in FIG. 12 is less than the total thickness D1 of the barrier layer 120 of the embodiment illustrated in FIG. 1. In addition, the thickness D110 of the pixel defining layer 110 in the embodiment illustrated in FIG. 12 is less than a thickness D130-1 of the first intermediate layer 130-1. However, the thickness D110 of the pixel defining layer 110 in the embodiment illustrated in FIG. 12 is greater than the thickness D131 of the first intermediate layer 130-1.

When the first intermediate layer 130-1 and the first opposite electrode 141 are deposited under the same or substantially similar conditions as in the embodiment illustrated in FIG. 1, the first common layer 131 and the first emissive layer 132 are disconnected at the boundary between the barrier layer 120 and the pixel defining layer 110 and the second common layer 135 and the first opposite electrode 141 are connected at the boundary between the barrier layer 120 and the pixel defining layer 110.

Because the first common layer 131 is disconnected at the boundary between the barrier layer 120 and the pixel defining layer 110, similar to the embodiment illustrated in FIG. 1, electrons do not flow from the first opposite electrode 141 to the first common layer 131 outside the pixel area. Accordingly, leakage current may be prevented or substantially reduced.

According to embodiments of the present disclosure, an intermediate layer including an emissive layer is formed by using a lift-off operation instead of depositing the same by using a fine metal mask, and thus, misalignment of the fine metal mask may be avoided and manufacturing costs may be reduced. In addition, by forming a barrier layer having an undercut structure on a pixel defining layer or by forming a pixel defining layer having an undercut structure, a hole injection layer at a boundary between the barrier layer and the pixel defining layer may be disconnected from itself, thereby preventing or substantially reducing leakage current.

According to embodiments of the present disclosure, an intermediate layer including an emissive layer is formed by using a lift-off operation instead of by depositing the same by using a fine metal mask, and thus, misalignment of the fine metal mask may be avoided and manufacturing costs may be reduced.

In addition, according to embodiments of the present disclosure, by forming a barrier layer having an undercut structure on a pixel defining layer or by forming a pixel defining layer having an undercut structure, a hole injection layer at a boundary between the barrier layer and the pixel defining layer may be disconnected from itself, thereby preventing or substantially reducing leakage current.

It should be understood that the example embodiments of the present disclosure described herein should be considered in a descriptive sense and not for purposes of limitation. Descriptions of features and/or aspects within each embodiment should typically be considered as available for other similar features or aspects in other embodiments.

While embodiments of the present disclosure have been described with reference to the figures, it will be understood by those of ordinary skill in the art that various changes in form and details may be made therein without departing from the spirit and scope of the present disclosure as defined by the following claims and their equivalents.

What is claimed is:

1. An organic light-emitting display device comprising:
    a substrate;
    a first pixel electrode and a second pixel electrode spaced from each other on the substrate;
    a pixel defining layer having a first opening exposing a center portion of each of the first and second pixel electrodes, the pixel defining layer continuously surrounding edges of each of the first pixel electrode and the second pixel electrode;
    a barrier layer on the pixel defining layer and continuously surrounding edges of each of the first pixel electrode and the second pixel electrode, the barrier layer comprising a first barrier layer and a second barrier layer, and having a second opening that is larger than the first opening and having an undercut structure in which an edge of a top surface of the barrier layer protrudes from a portion of the barrier layer below the top surface in a direction parallel to the substrate, a side of the second barrier layer being at an obtuse angle with respect to a side of the first barrier layer;
    a first intermediate layer comprising a first emissive layer, the first emissive layer being arranged on the first pixel electrode, the pixel defining layer, and the barrier layer;
    a second intermediate layer comprising a second emissive layer, the second emissive layer being arranged on the second pixel electrode, the pixel defining layer, and the barrier layer;
    a first electrode arranged on the first intermediate layer; and
    a second electrode arranged on the second intermediate layer,
    wherein the first electrode and the second electrode are electrically connected to each other, and
    wherein each of the first emissive layer and the second emissive layer is unconnected at the undercut structure.

2. The organic light-emitting display device of claim 1, wherein a thickness of the barrier layer is greater than a thickness of each of the first emissive layer and the second emissive layer.

3. The organic light-emitting display device of claim 1, wherein
    the first intermediate layer further comprises a first common layer between the first pixel electrode and the first emissive layer,
    the first common layer is further arranged between the second pixel electrode and the second emissive layer, and
    the first common layer is unconnected at the undercut structure.

4. The organic light-emitting display device of claim 3, wherein a thickness of the barrier layer is greater than a thickness of the first common layer.

5. The organic light-emitting display device of claim 1, wherein
    the first intermediate layer further comprises a second common layer between the first emissive layer and the first electrode,
    the second common layer is further arranged between the second emissive layer and the second electrode, and
    the second common layer is unconnected at the undercut structure.

6. The organic light-emitting display device of claim 5, wherein a thickness of the barrier layer is greater than a thickness of the second common layer.

7. The organic light-emitting display device of claim 1, wherein the first electrode and the second electrode comprise a metal comprising Ag, Al, Mg, Li, Ca, Cu, LiF/Ca, LiF/Al, or a compound thereof, or comprise a transparent conductive material comprising ITO, IZO, ZnO, $In_2O_3$, IGO, or AZO.

8. The organic light-emitting display device of claim 1, wherein the first electrode completely covers the first intermediate layer, and the second electrode completely covers the second intermediate layer.

9. The organic light-emitting display device of claim 1, further comprising a thin film encapsulation layer arranged on the first and second electrodes, the thin film encapsulation layer comprising at least one organic layer and at least one inorganic layer.

10. An organic light-emitting display device comprising:
    a substrate;
    a first pixel electrode and a second pixel electrode spaced from each other on the substrate;
    a pixel defining layer having a first opening exposing a center portion of each of the first and second pixel electrodes, the pixel defining layer continuously surrounding edges of each of the first pixel electrode and the second pixel electrode;
    a barrier layer on the pixel defining layer and continuously surrounding edges of each of the first pixel electrode and the second pixel electrode, the barrier layer comprising a first barrier layer, a second barrier layer, a bottom surface contacting the pixel defining layer, a top surface having an edge protruding from a portion of the barrier layer below the top surface in a direction parallel to the substrate, and a connection surface connecting the edge of the bottom surface and the edge of the top surface, a side of the second barrier layer being at an obtuse angle with respect to a side of the first barrier layer;

a first intermediate layer comprising a first emissive layer, the first emissive layer being arranged on the first pixel electrode, the pixel defining layer, and the barrier layer;

a second intermediate layer comprising a second emissive layer, the second emissive layer being arranged on the second pixel electrode, the pixel defining layer, and the barrier layer;

a first electrode arranged on the first intermediate layer; and a second electrode arranged on the second intermediate layer, wherein the first electrode and the second electrode are electrically connected to each other, and wherein each of the first emissive layer and the second emissive layer is unconnected at the connection surface of the barrier layer.

11. The organic light-emitting display device of claim 10, wherein a surface area of the first electrode is greater than a surface area of the first intermediate layer, and a surface area of the second electrode is greater than a surface area of the second intermediate layer.

12. The organic light-emitting display device of claim 10, wherein the first intermediate layer further comprises a first common layer or a second common layer, the first common layer being arranged between the first pixel electrode and the first emissive layer, and the second common layer being arranged between the first emissive layer and the first electrode.

13. The organic light-emitting display device of claim 12, wherein the first common layer is further arranged between the second pixel electrode and the second emissive layer, and the first common layer is unconnected at the connection surface of the barrier layer.

14. The organic light-emitting display device of claim 12, wherein the second common layer is further arranged between the second emissive layer and the second electrode, and the second common layer is unconnected at the connection surface of the barrier layer.

15. The organic light-emitting display device of claim 10, wherein the barrier layer comprises a second opening that is larger than the first opening.

16. The organic light-emitting display device of claim 10, wherein a thickness of the barrier layer is greater than a thickness of each of the first emissive layer and the second emissive layer.

17. The organic light-emitting display device of claim 10, wherein each of the first and second pixel electrodes comprises a plurality of layers, and at least one layer of the plurality of layers comprises a transparent conductive oxide material.

18. The organic light-emitting display device of claim 10, wherein the first electrode and the second electrode comprise a metal comprising Ag, Al, Mg, Li, Ca, Cu, LiF/Ca, LiF/Al, or a compound thereof, or comprise a transparent conductive material comprising ITO, IZO, ZnO, $In_2O_3$, IGO, or AZO.

* * * * *